United States Patent
Hu

(10) Patent No.: US 8,877,642 B2
(45) Date of Patent: Nov. 4, 2014

(54) DOUBLE-PATTERN GATE FORMATION PROCESSING WITH CRITICAL DIMENSION CONTROL

(71) Applicant: GLOBALFOUNDRIES Inc., Grand Cayman (KY)

(72) Inventor: Xiang Hu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/756,689

(22) Filed: Feb. 1, 2013

(65) Prior Publication Data

US 2014/0220767 A1  Aug. 7, 2014

(51) Int. Cl.
| H01L 21/02 | (2006.01) |
| H01L 21/66 | (2006.01) |
| H01L 21/302 | (2006.01) |
| H01L 21/28 | (2006.01) |
| H01L 21/033 | (2006.01) |
| H01L 29/66 | (2006.01) |
| H01L 21/82 | (2006.01) |

(52) U.S. Cl.
CPC ..... H01L 21/28008 (2013.01); *H01L 29/66545* (2013.01); *H01L 21/82* (2013.01); H01L 21/0338 (2013.01); *H01L 22/12* (2013.01)
USPC 438/689; 438/14; 257/E21.53; 257/E21.214; 430/322

(58) Field of Classification Search
None
See application file for complete search history.

(56) References Cited

U.S. PATENT DOCUMENTS

| 2001/0035558 | A1* | 11/2001 | Smith et al. ................. 257/408 |
| 2005/0269672 | A1* | 12/2005 | Visokay ..................... 257/635 |
| 2008/0286698 | A1* | 11/2008 | Zhuang et al. ............... 430/323 |
| 2009/0047791 | A1* | 2/2009 | Dobuzinsky et al. ......... 438/705 |
| 2011/0104863 | A1* | 5/2011 | Beyer et al. ................. 438/283 |
| 2011/0124134 | A1* | 5/2011 | Lin et al. ..................... 438/14 |
| 2012/0153474 | A1  | 6/2012 | Hu et al. |
| 2012/0256299 | A1  | 10/2012 | Hu et al. |

OTHER PUBLICATIONS

C. Auth et. al. 45 nm High-k + Metal Gate Strain Enhanced Transistors, 2008 Symposium on VLSI Technology Digest of Technical Papers p. 128-129.*

* cited by examiner

*Primary Examiner* — Charles Garber
*Assistant Examiner* — Alia Sabur
(74) *Attorney, Agent, or Firm* — Kevin P. Radigan, Esq.; Heslin Rothenberg Farley & Mesiti P.C.

(57) ABSTRACT

Fabricating of one or more semiconductor devices with critical gate dimension control is facilitated by: providing a multilayer stack structure over a substrate; etching through the multilayer stack structure, with critical gate dimension control, to define multiple gate lines; providing a protective layer over the multiple gate lines; and patterning and cutting one or more gate lines of the multiple gate lines to facilitate defining multiple gate structures of the one or more semiconductor devices. Etching through the multilayer stack structure is facilitated by lithographically patterning the multilayer stack structure, and critical dimension feedback control is provided to at least one of the lithographically patterning or the etching through the multilayer stack structure.

20 Claims, 6 Drawing Sheets

DOUBLE-PATTERN GATE FORMATION PROCESSING WITH CRITICAL DIMENSION CONTROL

FIELD OF THE INVENTION

The present invention relates to integrated circuits and to methods of fabricating the same, and more particularly, to double-patterning methods with critical gate dimension control for use in facilitating fabricating gate structures for one or more semiconductor devices.

BACKGROUND OF THE INVENTION

A finished gate structure (such as a finished gate electrode or transistor gate) is the transistor terminal that modulates channel conductivity. Two principal approaches for forming semiconductor device gate structures are the gate-first and gate-last process approaches.

During fabrication of gate structures for, for instance, complementary metal-oxide-semiconductor (CMOS) technology, gate-first fabrication has traditionally been employed. In a gate-first fabrication approach, a conductor is provided over a gate dielectric, and then patterned and etched to form one or more gate structures. After forming the gate structures, source and drain features of the semiconductor devices are provided.

More recently, the gate-last approach (or replacement metal gate (RMG) approach) has been employed. In the gate-last approach, a sacrificial (or dummy) gate material is provided, patterned and etched to define one or more sacrificial gates. The one or more sacrificial gates are subsequently replaced with, for instance, corresponding replacement metal gates, that is, after source and drain features of the devices have been formed. The sacrificial gate material holds the position for the subsequent metal gate to be formed. For instance, an amorphous silicon (a-Si) or polysilicon sacrificial gate material may be patterned and used during initial processing until high-temperature annealing to activate the source and drain features has been completed. Subsequently, the a-Si or polysilicon may be removed and replaced with the final metal gate.

A goal of integrated circuit fabrication technology is to continue reducing the size of transistors, such as the metal oxide semiconductor field-effect transistors (MOSFETs) often employed in integrated circuits or semiconductor devices in order to reduce the size of the resultant devices and thereby provide higher performance, with lower power consumption. This goal includes continuing to provide enhancements to the above-noted gate fabrication approaches, including the gate-last processing approach for fabricating a gate structure.

BRIEF SUMMARY

The shortcomings of the prior art are overcome, and additional advantages are provided through the provision, in one aspect, of a method which includes, for instance: facilitating fabricating of one or more semiconductor devices with critical gate dimension control. The facilitating fabricating includes: providing a multilayer stack structure over a substrate; etching through the multilayer stack structure, with critical dimension control, to define multiple gate lines; providing a protective layer over the multiple gate lines; and patterning and cutting one or more gate lines of the multiple gate lines to facilitate defining multiple gate structures of the one or more semiconductor devices.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Figure 1:
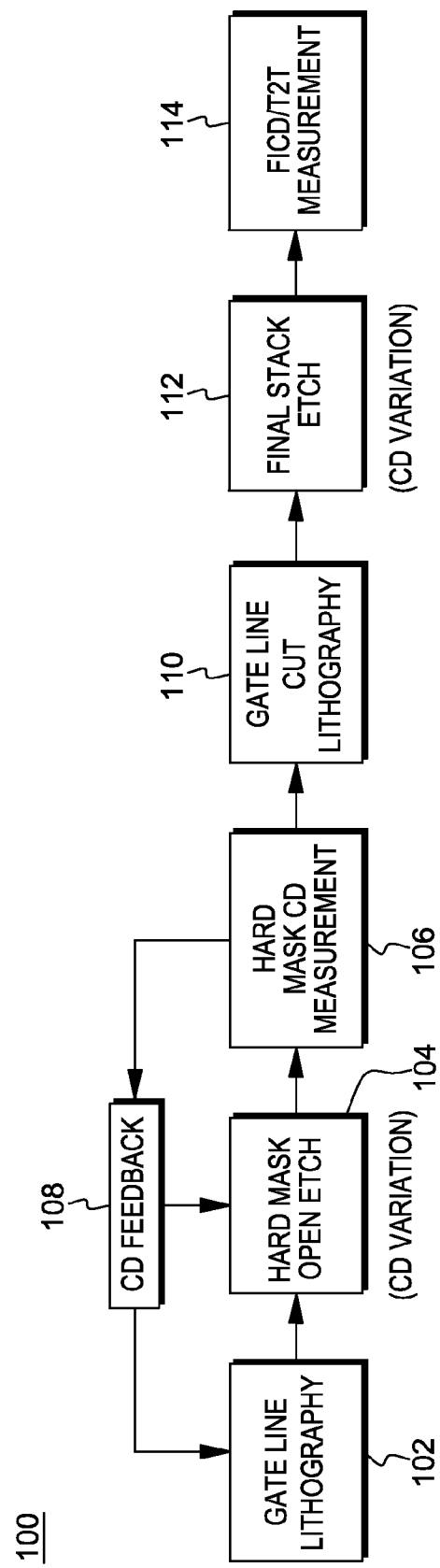
FIG. 1 depicts one embodiment of a double-patterning process for forming gate structures of one or more semiconductor devices.

The present disclosure addresses and enhances, inter alia, gate stack formation with critical gate dimension control for use, for instance, in a gate-last or replacement metal gate process. FIG. 1 depicts one embodiment of a double-patterning process 100 for facilitating forming sacrificial gate structures for use in a gate-last processing approach employed in forming one or more semiconductor devices. Double-patterning process 100 includes performing gate line (or polysilicon) lithography 102 to pattern a multilayer stack structure, which includes (in one example) a polysilicon layer and a hard-mask layer. A hard-mask open etch process 104 is then performed to etch the pattern of the polysilicon gate lines into the hard-mask layer, and hard-mask critical dimension (CD) measurements 106 are made in order to provide critical dimension (CD) feedback 108 to one or both of the lithographic patterning process 102 and the hard-mask open etch process 104. Once the gate lines (or polysilicon lines) are patterned into the hard-mask layer, a second patterning process, referred to as the cut lithography (CT) process 110, is performed to pattern the structure (e.g., wafer) with one or more cut openings at least partially overlying the gate lines to be formed beneath the patterned hard-mask layer. After the cut lithography patterning 110 of the wafer, a final stack etch of the multilayer stack structure is performed 112. Final inspection of critical dimension (FICD) measurements, including tip-to-tip (T2T) distance measurements, may be used to monitor the final stack etch process performance.

Note that using a double-patterning approach such as depicted in FIG. 1 results in critical dimension variation at both the hard-mask open etch process 104 and the final cut etch process 112. Although a critical dimension feedback process 108 may be employed in enhancing the gate line or polysilicon lithography patterning 102 and/or the hard-mask opening etch 104, a secondary critical dimension feedback process from the final inspection of critical dimensions (FICD) monitoring 114 to, for instance, the original gate line lithography patterning 102, would be problematic. The use of two such feedback paths would also make advanced process control (APC) more complicated, and in fact, impractical due (for instance) to the feedback lag time from the final stack etch processing 112 back to the initial gate line or polysilicon lithography patterning 102. In accordance with this approach, both the hard-mask open and cut lithography combine together when the final etch through the multilayer stack structure is performed. Unfortunately, as noted, at each of the etch process steps, there is a possibility for critical dimension variation.

FIGS. 2A-2E depict one example of the double-patterning process of FIG. 1 for facilitating forming, for instance, sacrificial gate structures used during fabrication of one or more semiconductor devices. Beginning with FIG. 2A, an isometric view of a partial cutaway of one embodiment of an intermediate structure 200 is depicted. Intermediate structure 200 includes a substrate 201, such as a semiconductor substrate (for instance, a silicon substrate), and multiple layers disposed over substrate 201. The multiple layers may include, for instance, a gate dielectric layer 202, and a multilayer stack structure which includes a work-function metal layer 204 over gate dielectric layer 202, a sacrificial gate layer 206 over work-function metal layer 204, and hard mask layers, such as a first hard-mask layer 208 and a second hard-mask layer 210, disposed over sacrificial gate layer 206. In one embodiment, sacrificial gate layer 206 is an amorphous-silicon (a-Si) or a polysilicon material, which as understood in the art, may be employed to hold the gate positions for the subsequent metal gate electrodes to be formed. These layers of the structure of FIG. 2A may be formed using a variety of different materials and fabrication techniques, such as chemical-vapor deposition (CVD), atomic layer deposition (ALD), physical vapor deposition (PVD), or plasma-enhanced versions of such processes. The thicknesses of the depicted layers may also vary, depending on the particular application.

As one specific example, gate dielectric layer 202 may be a high-k dielectric material layer formed over a silicon substrate 201. A titanium-nitride layer 204 may be formed over high-k dielectric layer 202, and an amorphous-silicon layer 206 formed over the titanium-nitride layer 204. Hard-mask layers 208, 210 may subsequently be formed over the amorphous-silicon layer 206. By way of specific example, the high-k dielectric material layer may be formed of hafnium-oxide having a thickness of (for instance) 15-20 angstroms, the titanium-nitride layer may be formed having a thickness of (for instance) 50-60 nm, and the amorphous-silicon layer may be formed having a thickness of (for instance) 600 angstroms. Also by way of example, as used herein, high-k dielectric material refers to a material having a dielectric constant (k) greater than about 3.9 (k=3.9 for $SiO_2$), such as hafnium-oxide ($HfO_2$), hafnium-silicon-oxide ($HfSiO_3$), or hafnium-lanthanum-oxide ($HfLaO_x$). By way of further example, first hard-mask layer 208 may be a layer of silicon-nitride, having been formed by CVD processing, be protected by second hard-mask layer 210, which may be fabricated of a variety of materials, with the material of second hard-mask layer 210 being different from that of first hard-mask layer 208. In one example, second hard-mask layer 210 is tetraethyl orthosilicate (TEOS) layer, having been formed by a CVD process.

Figure 2A:
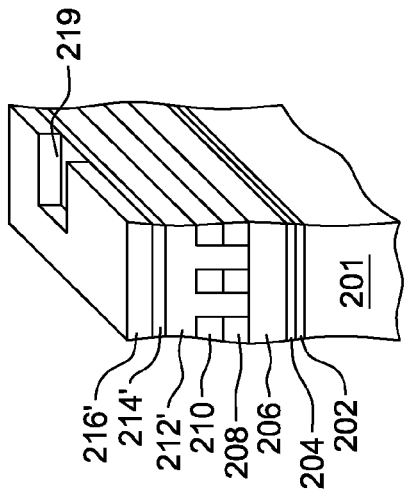
FIGS. 2A-2E depict one example of the double-patterning process of FIG. 1 for facilitating forming gate structures of one or more semiconductor devices.

As noted, FIG. 2A depicts one example of a structure to undergo the gate line or polysilicon (PC) lithography patterning process step of FIG. 1. This processing step includes (for instance) providing an optical dispersive layer 212 disposed over protective hard-mask layer 210, providing an anti-reflective coating (ARC) 214 disposed over optical dispersive layer 212, and providing a patterned photoresist 216 over anti-reflective coating 214. In one example, anti-reflective coating 214 may be a silicon anti-reflective coating used to minimize pattern distortions due to reflections from the subsequent etching process. The patterned photoresist 216 defines openings 217, which facilitate the subsequent patterning of the hard-mask layers 208, 210.

Figure 2B:
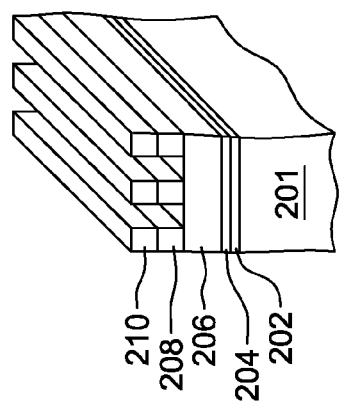

The hard-mask open etching step of FIG. 1 is subsequently performed, resulting in an intermediate structure such as depicted in FIG. 2B. In particular, etching, such as by dry-etching, is performed to transfer the photoresist pattern to the hard-mask layers 208, 210, resulting in a structure such as depicted in FIG. 2B, in which the photoresist layer, anti-reflective coating, and optical dispersion layers, have been removed. Note that in this implementation, the hard-mask open etch process proceeds through the first and second hard-mask layers 208, 210, stopping on the polysilicon layer 206. One or more etch process operations may be utilized at this stage, including (for example) an anti-reflective coating open step, an optical dispersion layer open step, and one or more hard-mask open steps.

Figure 2C:
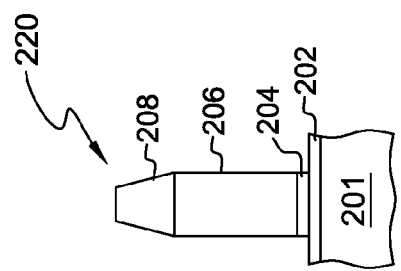
Figure 2D:
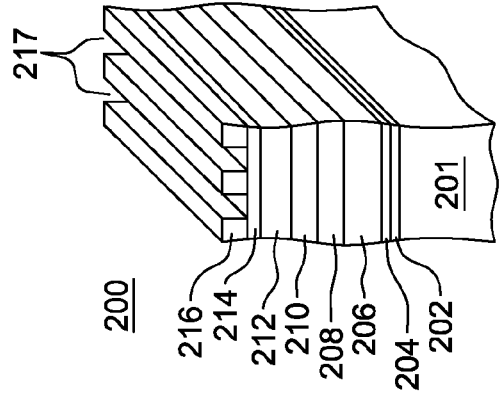
Figure 2E:
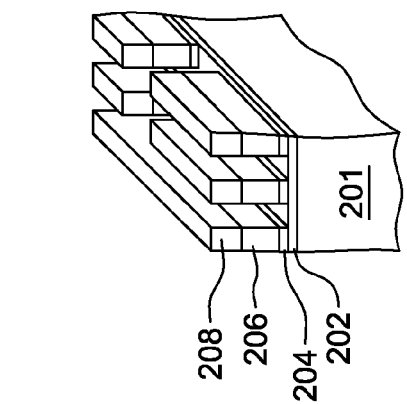

In FIG. 2C, the cut lithography patterning 110 of process of FIG. 1 has been performed. This includes providing an optical dispersive layer 212' overlying the hard mask layers 208, 210 and filling the openings in the hard-mask layers, and providing an anti-reflective coating layer 214', and a patterned photoresist layer 216' with one or more openings 219, that overlie (at least partially) the patterned lines in the hard-mask layers 208, 210. A final stack etch is then performed to obtain the structure of FIG. 2D, wherein the amorphous-silicon or polysilicon is etched to facilitate defining the desired gate structures, such as the desired sacrificial gate structures 220 (FIG. 2E). Note that the final stack etch results in both the gate lines and the gate cuts being formed concurrently in the amorphous-silicon or polysilicon layer. As depicted in FIG. 2E, rounding of the hard-mask layer 208 also often disadvantageously occurs during this final stack etch process. This hard mask rounding profile may cause subsequent epitaxial growth problems in the upper region of the sacrificial gate material, and for at least this reason, is undesirable.

As noted above, it is difficult for the double-patterning, high-k metal gate etch process of FIGS. 1-2E to implement advanced process control of critical dimensions. There are two critical dimension variation sources in the process flow of FIGS. 1-2E, that is, the hard-mask open etch process, and the final stack etch process. Using hard-mask critical dimension measurements 106 (FIG. 1), it is possible for feedback to be provided to facilitate advanced process control of the first stage, but no reliable feedback control is possible for critical dimensions resulting from the final stack etch stage.

Figure 3:
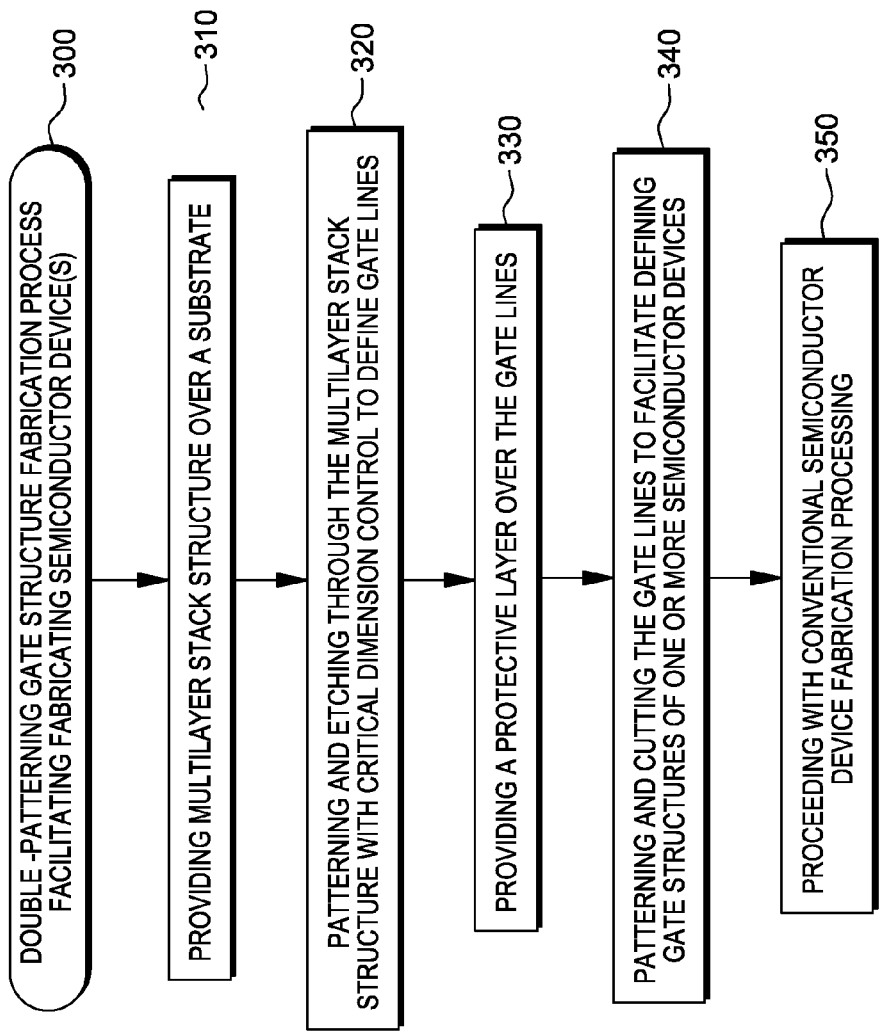
FIG. 3 depicts one embodiment of an enhanced double-patterning process for facilitating fabricating gate structures of one or more semiconductor devices with critical gate dimension control, in accordance with one or more aspects of the present invention.

To address these issues, disclosed herein is an enhanced, double-patterning process for facilitating fabricating gate structures with critical gate dimension control. In one implementation, the gate structures may be sacrificial gates formed as part of a gate-last or replacement metal gate process. FIG. 3 depicts one embodiment of this enhanced, double-patterning process approach for facilitating fabricating gate structures used in fabricating one or more semiconductor devices, in accordance with one or more aspects of the present invention.

As illustrated in FIG. 3, critical gate dimension control is facilitated 300 by providing a multilayer stack structure over a substrate 310, and patterning and etching through the multilayer stack structure, with critical gate dimension control, to define multiple gate lines 320. To restate, this processing includes etching through the multilayer stack structure, including through the amorphous-silicon or polysilicon layer (that is, for instance, the sacrificial layer). A protective layer is subsequently conformally deposited over the multiple gate lines 330. This protective layer may include, in one embodiment, an amorphous carbon layer which protects, for instance, the sidewalls of the work-function metal layer of the multilayer stack structure from etching away during subsequent processing. The gate lines are then patterned and cut to facilitate defining multiple gate structures 340. After this, conventional semiconductor device fabrication processing may be employed 350, including (for instance) conventional gate-last or replacement metal gate processing, such as sidewall spacer formation, sacrificial gate material removal, and metal gate formation.

FIGS. 4A-4L depict (by way of example only) one detailed example of an enhanced, double-patterning process for fabricating gate structures, with critical gate dimension control, which may be used in facilitating fabricating one or more semiconductor devices, in accordance with one or more aspects of the present invention.

Figure 4A:
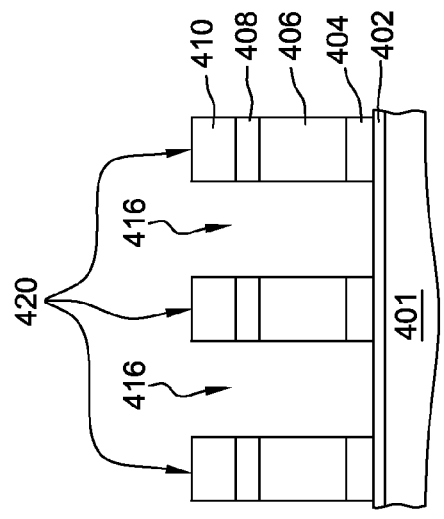
FIG. 4A depicts a cross-sectional elevational view of one embodiment of a patterned multilayer stack structure obtained during fabrication of one or more semiconductor devices using, in part, the gate fabrication approach of FIG. 3, in accordance with one or more aspects of the present invention.

FIG. 4A is a cross-sectional elevational view of one embodiment of an intermediate structure 400 attained during gate structure formation processing, in accordance with one or more aspects of the present invention. As illustrated in FIG. 4A, intermediate structure 400 includes a substrate 401, such as a semiconductor substrate (for instance, a silicon substrate), above which a gate dielectric layer 402 resides. A multilayer stack structure 403 is shown disposed over gate dielectric layer 402. This multilayer stack structure 403 includes, for instance, one or more work-function metal layers 404, a sacrificial gate material layer 406, and one or more protective hard-mask layers 408 disposed over sacrificial gate material layer 406.

By way of example only, substrate 401 may be a silicon substrate or wafer, gate dielectric layer 402 may be a high-k dielectric layer with a dielectric constant k greater than, for instance, about 3.9 (e.g., k=3.9 for $SiO_2$). The gate dielectric layer may be deposited by performing a suitable deposition process, such as atomic layer deposition (ALD), chemical-vapor deposition (CVD), physical vapor deposition (PVD), or the like. In one specific example, the high-k dielectric layer 402 may include a material such as hafnium-oxide ($HfO_2$), hafnium-silicon-oxide ($HfSiO_3$), or hafnium-lanthanum-oxide ($HfLaO_x$). Work-function metal layer(s) 404 may be conformally deposited over gate dielectric layer 402, for instance, using a deposition process such as ALD, CVD, or PVD. The work-function metal layer(s) 404 may include an appropriate refractory metal nitride, for example, those from Groups IVa-VIa in the periodic table, such as titanium-nitride (TiN), tantalum-nitride (TaN), niobium-nitride (NbN), vadnium-nitride (VN), tungsten-nitride (WN), and the like. The sacrificial gate material layer 406 may include, for instance, an amorphous-silicon (a-Si) or a polysilicon material, which as known, may be used (in one embodiment) to hold the gate position for the subsequent metal gate electrodes to be formed using a gate-last processing approach. The protective hard-mask layer(s) 408 may be deposited over the sacrificial gate material 406 using conventional deposition processes, such as CVD, PVD, or ALD. This hard-mask layer(s) 408 may be used, in part, to preserve the patterning of smaller features than can be preserved using an organic etch mask. Although protective hard-mask layer 408 may include materials such as metal, spin-on organic material, silicon-dioxide, silicon-nitride, silicon-carbide, tetraethyl orthosilicate (TEOS), silicon-nitride-carbide (SiCN), silicon-oxynitride (SiON), spin-on glass (SOG), or any combination thereof, in one embodiment, the hard-mask material is a nitride hard-mask layer (as one example only).

The intermediate stack structure 400 of FIG. 4A further includes, in this example, an optical dispersive layer 410, an anti-reflective coating 412, and a photoresist layer 414, which has been patterned with openings 415, by way of example only. In one embodiment, optical dispersive layer 410 may be provided using conventional deposition processes. As is known, this layer functions to refract portions of light waves that pass through it, so as to provide greater accuracy in subsequent lithography processing. As one example, optical dispersive layer 410 may be any of those conventionally employed during a pattern transfer process, such as ODL 63 or HM8006. Anti-reflective coating layer 412 may be, for instance, a silicon anti-reflective layer (Si-ARC), which is deposited over optical dispersive layer 410 to minimize any pattern distortion due to reflections. Anti-reflective coating 412 may include materials having silicon and nitrogen, silicon and oxygen, or silicon, oxygen and nitrogen, or an organic polymer, or combinations thereof. As is known, patterned photoresist layer 414 protects underlying layers in the direction of etching during the subsequent etch processing, and defines the openings 415 through which the etch process proceeds. Patterned photoresist layer 414 may include, for instance, organic photoresist materials, non-organic materials, or combinations thereof.

Figure 4B:
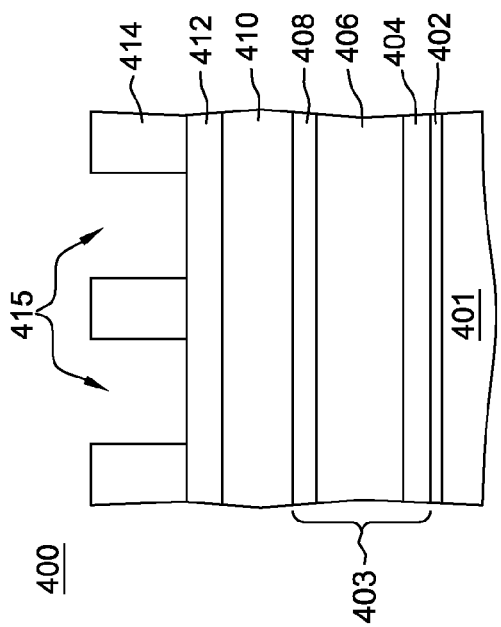
FIG. 4B is a cross-sectional elevational view of the structure of FIG. 4A, after etching through the patterned multilayer stack structure with critical gate dimension control, to define multiple gate lines, in accordance with one or more aspects of the present invention.
Figure 4C:
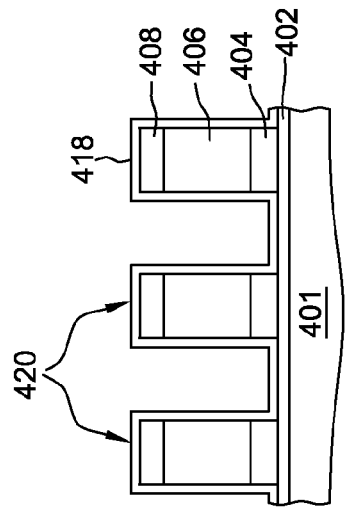
FIG. 4C is a cross-sectional elevational view of the structure of FIG. 4B, after removal of the remaining optical dispersion layer over the multiple gate lines, in accordance with one or more aspects of the present invention.

Etching through the multilayer stack structure 403, with critical gate dimension control, is then performed to define multiple gate lines 420, separated by spaces 416, as illustrated in FIG. 4B. This etching through the multilayer stack structure may be performed as one or more etch process steps, and is used to transfer the photoresist layer pattern 414 to the multilayer stack structure 403. Note that this etch processing stops, in this example, on gate dielectric layer 402, and that a portion of the optical dispersive layer 410 may remain over the hard-mask layers 408 in gate lines 420 defined from the multilayer stack structure 403. As shown in FIG. 4C, dry-strip and wet-clean processing may subsequently be used to remove optical dispersive layer 410, leaving gate lines 420 exposed. These gate lines 420 advantageously have hard-mask layers 408 with squared edges over the sacrificial material layer 406, not rounded edges, as in the approach described above in connection with FIGS. 2A-2E. The squared edges of the hard-mask layer 408 better protect the underlying amorphous-silicon or polysilicon gate material layer 406, for instance, during subsequent chemical etch processing, or from subsequent epitaxial growth from the upper regions of the gate material layer during later epitaxial processing.

Figure 4D:
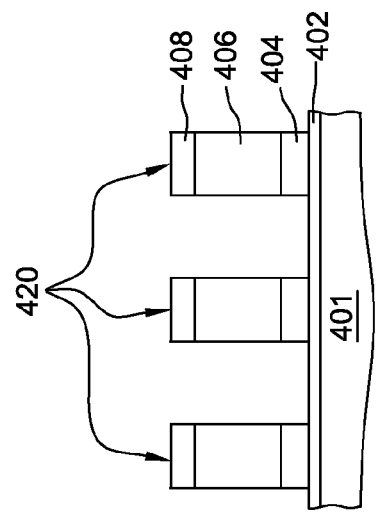
FIG. 4D is a cross-sectional elevational view of the structure of FIG. 4C, after conformal deposition of a protective layer over the structure, including over the multiple gate lines, in accordance with one or more aspects of the present invention.

As illustrated in FIG. 4D, a protective layer 418 is subsequently provided, for instance, conformally deposited over the multiple gate lines 420. By way of example, this protective layer 418 may be a conformally deposited, amorphous-carbon layer, which may have a thickness in the range of 3-50 nm for, for instance, fabrication using 32 nm fabrication technology and below. This conformal layer advantageously protects, for example, the sidewalls of work-function metal layer(s) 404 from attack during subsequent processing.

Figure 4H:
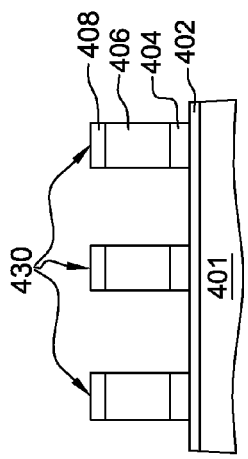
FIGS. 4H & 4I are cross-sectional elevational views of the structures of FIGS. 4F & 4G, respectively, after removal of the remaining optical dispersion layer, and removal of the conformal protective layer, in accordance with one or more aspects of the present invention.
Figure 4I:
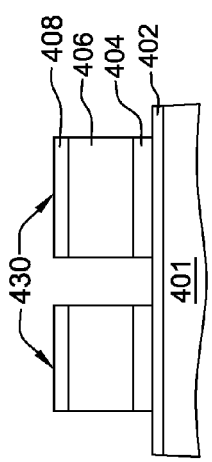
Figure 4F:
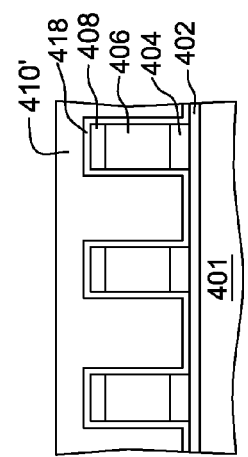
FIGS. 4F & 4G are cross-sectional elevational views of the structure of FIG. 4E, taken along different orthogonal view lines, after cutting of the one or more gate lines to facilitate defining multiple gate structures for the one or more semiconductor devices, in accordance with one or more aspects of the present invention.
Figure 4G:
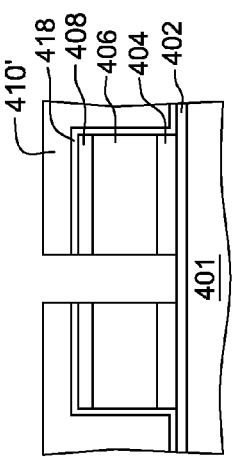
Figure 4L:
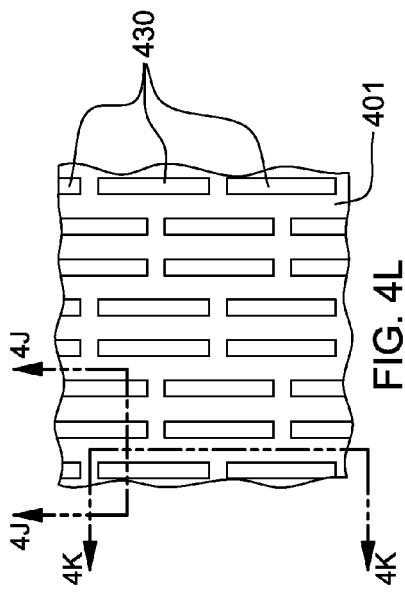
FIG. 4L is a partial plan view of one embodiment of the structure of FIGS. 4J & 4K, in accordance with one or more aspects of the present invention.
Figure 4E:
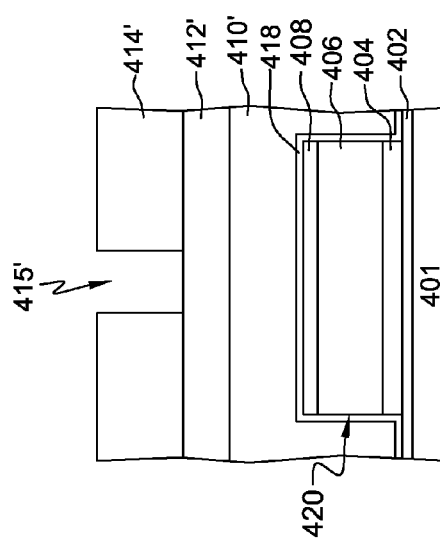
FIG. 4E is a cross-sectional elevational view of the structure of FIG. 4D, after patterning one or more gate lines to define cut openings to facilitate defining multiple gate structures of the one or more semiconductor devices, in accordance with one or more aspects of the present invention.

As illustrated in FIG. 4E, the intermediate structure is next patterned for cutting of one or more of the gate lines 420 to facilitate defining multiple gate structures 430 (see FIGS. 4H-4L). This patterning includes (in one embodiment) providing an optical dispersive layer 410' over protective layer 418, as well as providing an anti-reflective coating 412', and an appropriately patterned photoresist layer 414'. These layers may be similar layers to the above-discussed, optical dispersive layer 410, anti-reflective coating layer 412, and photoresist layer 414, respectively. However, at this process stage, the photoresist is pattered with one or more cut openings 415' aligned, at least partially, over one or more of the gate lines 420 to define cut regions where the gate lines are to be separated to facilitate defining the desired gate structures of the one or more semiconductor devices.

Figure 4J:
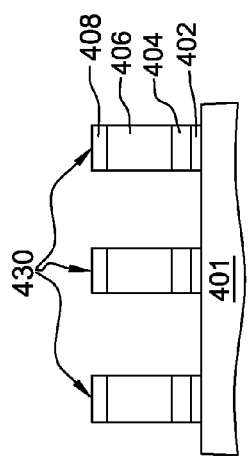
FIGS. 4J & 4K are cross-sectional elevational views of the structure of FIGS. 4H & 4I, respectively, and taken along lines 4J-4J and 4K-4K, respectively, in the plan view of FIG. 4L, and showing the structure after removal of the gate dielectric layer from over the substrate in one or more regions outside of the multiple gate structures, in accordance with one or more aspects of the present invention.
Figure 4K:
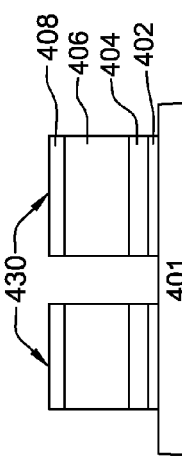

FIGS. 4F & 4G depict the structure of FIG. 4E, after etching through the one or more gate lines to define the separate gate structures. At this process stage, the optical dispersive layer 410' at least partially remains, which is subsequently removed, along with the protective layer 418, to produce the gate structures of FIGS. 4H & 4I. Note (by way of example) that FIGS. 4F, 4H & 4J depict the intermediate structure at different process stages when viewed from a first cross-sectional direction, for example, an x direction, and FIGS. 4G, 4I & 4K depict the intermediate structure at different process stages when viewed from a transverse cross-sectional direction, for example, a y axis cross-sectional direction. This is depicted in the plan view of FIG. 4L for FIGS. 4J and 4K.

After removal of the remaining optical dispersive layer 410', the protective layer (e.g., the conformally deposited, amorphous-carbon layer) can be removed via an oxygen strip process, with the resultant intermediate structure being depicted in the two transverse elevational views of FIGS. 4H & 4I. After defining the multiple gate structures 430, the gate dielectric layer 402 in the regions outside of the gate structures 430 may be removed, resulting in the structures depicted in FIGS. 4J & 4K. In one example, the gate dielectric layer 402 may be etched in a first plasma having a halogen-containing gas, such as chlorine, and a reducing gas, such as carbon monoxide. Any post-etch residue may be removed in a second plasma having a residue-cleaning gas, such as oxygen, or a mixture of oxygen and nitrogen.

As noted, FIG. 4L is a partial plan view of a resultant intermediate structure, showing the gate structures disposed over the substrate 401. Note with respect to these views that the hard-mask layer 408 remains a portion of each gate structure, and contains squared edges, rather than the rounded edges in the embodiment of FIGS. 2A-2E. The squared edges better protect the underlying gate material (such as amorphous-silicon or polysilicon) from, for instance, subsequent undesired etching thereof, or undesired epitaxial growth from the gate material.

Figure 5:
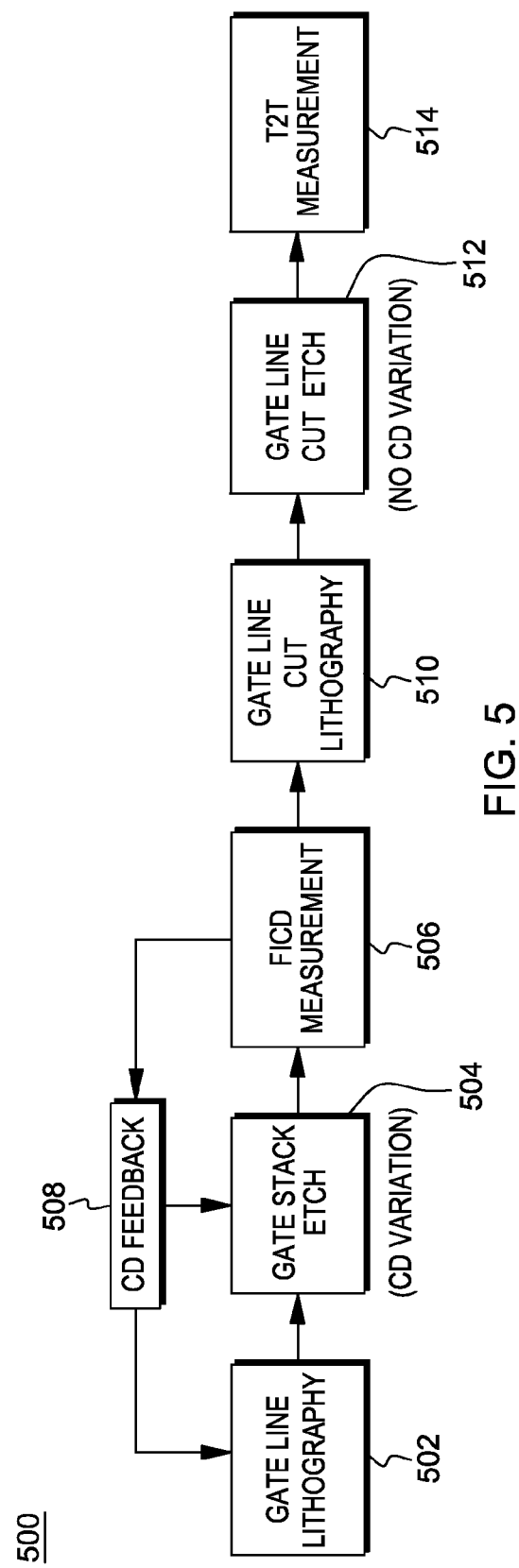
FIG. 5 depicts one embodiment of a double-patterning process with critical gate dimension control, for facilitating forming gate structures used in fabricating one or more semiconductor structures, in accordance with one or more aspects of the present invention.

FIG. 5 is an overview of the double-patterning process described above in connection with FIGS. 3-4L, and illustrates the enhanced critical gate dimension control achieved using this process. The process 500 begins with the gate lithography patterning process 502, and includes a gate stack etch process 504, which results in an etch through the multilayer stack structure disposed over the substrate. Final inspection critical dimension (FICD) measurement 506 may be employed and used in critical dimension (CD) feedback control 508 of either/or both the gate line lithography patterning process 502 and/or the gate stack etching process 504. The gate line cut lithography patterning 510 is subsequently performed, after provision of a protective layer over the gate lines, and the cut etching process 512 results in opening of the gate lines to define the desired gate structures, after which tip-to-tip (T2T) measurement 514 may be performed. Note that the only critical dimension variation in this process flow occurs at the gate stack etch 504, and that feedback control of this critical dimension is readily achieved, since the measurement and feedback is local to the lithography patterning and etch steps. The subsequent cut etch processing to cut the gate lines and define the gate structures does not result in critical gate dimension variation, and thus critical dimension variation can be controlled only by the gate stack etch process 504. The result is a more reliable and effective advanced process control approach that is practical to implement. Additionally, the process disclosed in FIGS. 3-5 results in gate lines with overlying hard-mask layers having squared upper edge profiles, which better protect the underlying, amorphous-silicon or polysilicon material. Further, the use of the protective layer during the described processing, such as a conformally deposited, amorphous-carbon layer, protects the sidewalls of the underlying work-function metal layer from the risk of etching during subsequent processing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating of one or more semiconductor devices with critical gate dimension control, the fabricating comprising:
   providing a multilayer stack structure over a gate dielectric layer, the multilayer stack structure comprising a gate material disposed above the gate dielectric;
   etching through the multilayer stack structure, with critical dimension control, to define multiple gate lines extending above the substrate, the etching including etching through the gate material to the gate dielectric layer, exposing a portion of the gate dielectric layer;
   providing a conformal protective layer wrapping over the multiple gate lines defined with critical dimensional control, and covering the exposed portion of the gate dielectric layer;
   after providing the conformal protective layer, defining one or more cut openings over the conformal protective layer and one or more gate lines of the multiple gate lines, and cutting, in part, through the conformal protective layer and the one or more gate lines, the cutting defining one or more cuts in the one or more gate lines and facilitating defining multiple gate structures of the one or more semiconductor devices, wherein the conformal protective layer protects the multiple gate lines outside the one or more cut openings; and
   removing the conformal protective layer from the multiple gate lines and the multiple gate structures of the one or more semiconductor devices.

2. The method of claim 1, further comprising lithographically patterning the multilayer stack structure, and wherein the etching comprises etching through the lithographically patterned multilayer stack structure.

3. The method of claim 2, further comprising providing critical dimension feedback control of at least one of the lithographically patterning or the etching through the multilayer stack structure.

4. The method of claim 1, wherein the etching comprises etching through the multilayer stack structure to the gate dielectric layer.

5. The method of claim 4, wherein the gate dielectric layer comprises a high-k gate dielectric layer.

6. The method of claim 4, wherein the providing the protective layer comprises conformally depositing an amorphous carbon layer over the multiple gate lines.

7. The method of claim 6, wherein the removing comprises removing the amorphous carbon layer after the patterning and cutting using an oxygen strip process.

8. The method of claim 4, wherein the defining and cutting comprises defining and cutting through the one or more gate lines of the multiple gate lines to the gate dielectric layer.

9. The method of claim 4, further comprising removing the gate dielectric layer from over the substrate in regions outside of the multiple gate structures, leaving the gate dielectric layer between the multiple gate structures and the substrate.

10. The method of claim 1, wherein the gate material of the multilayer stack structure comprises a layer of amorphous silicon or polysilicon.

11. The method of claim 10, wherein the layer of amorphous silicon or polysilicon is a sacrificial layer, and the multiple gate structures are multiple sacrificial gates used in a replacement metal gate fabrication process.

12. The method of claim 10, wherein the multilayer stack structure further comprises a layer of titanium nitride disposed below the layer of amorphous silicon or polysilicon, and a protective hard-mask layer disposed over the layer of amorphous silicon or polysilicon.

13. The method of claim 12, wherein the protective hard-mask layer comprises a nitride hard-mask layer.

14. The method of claim 12, further comprising patterning the multilayer stack structure prior to the etching through the multilayer stack structure, the patterning the multilayer stack structure comprising providing an optical dispersive layer disposed over the protective hard-mask layer, and an anti-reflective coating over the optical dispersive layer, and providing a patterned photoresist over the anti-reflective coating which defines openings that facilitate the multilayer etching through the multilayer stack structure.

15. The method of claim 14, further comprising removing the optical dispersive layer after the etching through the multilayer stack structure, leaving the gate lines of the multiple gate lines with squared edges.

16. The method of claim 1, wherein the defining and cutting comprise providing a lithographically patterned photoresist over the multiple gate lines with the one or more cut openings at least partially overlying the one or more gate lines, and the cutting comprises etching the one or more gate lines through the one or more cut openings.

17. The method of claim 1, wherein the multiple gate structures comprise squared upper edges.

18. The method of claim 1, wherein the facilitating fabricating further comprises:
- lithographically-patterning the multilayer stack structure, wherein the etching comprises etching through the lithographically-patterned, multilayer stack structure;
- providing critical dimension feedback control to at least one of the lithographically-patterning or the etching through the multilayer stack structure; and
- wherein the etching comprises etching through the multilayer stack structure to the gate dielectric layer.

19. The method of claim 18, wherein the defining and cutting comprise providing a lithographically patterned photoresist over the multiple gate lines with the one or more cut openings at least partially overlying the one or more gate lines, and the cutting comprises etching the one or more gate lines through the one or more cut openings.

20. The method of claim 19, wherein the multiple gate structures comprise squared upper edges.

* * * * *